(12) United States Patent
Seo et al.

(10) Patent No.: US 8,558,270 B2
(45) Date of Patent: Oct. 15, 2013

(54) LIGHT EMITTING DEVICE

(75) Inventors: Eun Jung Seo, Ansan (KR); Jae Ho Cho, Ansan (KR); Bang Hyun Kim, Ansan (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 80 days.

(21) Appl. No.: 13/105,549

(22) Filed: May 11, 2011

(65) Prior Publication Data

US 2011/0210366 A1    Sep. 1, 2011

Related U.S. Application Data

(63) Continuation of application No. 12/339,665, filed on Dec. 19, 2008, now Pat. No. 7,964,943.

(30) Foreign Application Priority Data

Nov. 18, 2008    (KR) .......................... 10-2008-0114624

(51) Int. Cl.
*H01L 33/00* (2010.01)

(52) U.S. Cl.
USPC .................... 257/99; 257/98; 257/E33.059

(58) Field of Classification Search
CPC ................. H01L 33/62; H01L 33/486; H01L 2224/48091
USPC ............................... 257/98, 99, E33.059, 100
See application file for complete search history.

(56) References Cited

U.S. PATENT DOCUMENTS

| 6,335,548 B1 | 1/2002 | Roberts et al. |
| 2002/0066905 A1 | 6/2002 | Wang et al. |
| 2004/0000727 A1 | 1/2004 | Hsu |
| 2004/0126913 A1* | 7/2004 | Loh ................................. 438/26 |
| 2006/0043401 A1 | 3/2006 | Lee et al. |
| 2006/0133044 A1* | 6/2006 | Kim et al. ..................... 361/704 |
| 2006/0220048 A1* | 10/2006 | Matsumoto et al. ............ 257/98 |
| 2007/0047262 A1 | 3/2007 | Schardt et al. |
| 2007/0241362 A1 | 10/2007 | Han et al. |
| 2007/0290220 A1 | 12/2007 | Wang et al. |
| 2008/0128724 A1* | 6/2008 | Isobe et al. ...................... 257/98 |

FOREIGN PATENT DOCUMENTS

| JP | 2001-077278 | 3/2001 |
| JP | 2003-068962 | 3/2003 |
| JP | 2006-066813 | 3/2006 |

(Continued)

OTHER PUBLICATIONS

Non-Final Office Action of Oct. 27, 2010 in U.S. Appl. No. 12/339,665.

(Continued)

*Primary Examiner* — Nikolay Yushin
(74) *Attorney, Agent, or Firm* — H.C. Park & Associates, PLC

(57) ABSTRACT

Provided is a light emitting device. The light emitting device includes: a plurality of lead frame units spaced apart from each other, each of the lead frame units being provided with at least one fixing space perforating a body thereof in a vertical direction; a light emitting diode chip mounted on one of the lead frame units; and a molding unit that is integrally formed on top surfaces of the lead frame units and in the fixing spaces to protect the light emitting diode chip.

13 Claims, 9 Drawing Sheets

(56) References Cited

FOREIGN PATENT DOCUMENTS

| | | | |
|---|---|---|---|
| JP | 2007-067443 | | 3/2007 |
| JP | 2007-134376 | | 5/2007 |
| WO | WO2006/016398 | * | 2/2006 |

OTHER PUBLICATIONS

Notice of Allowance of Mar. 10, 2011 in U.S. Appl. No. 12/339,665.
The Extended European Search report of European Patent Application No. 08021901.7 was mailed Jul. 6, 2012.

* cited by examiner

10(110,120)
20(111,115,121,125)

LIGHT EMITTING DEVICE

CROSS-REFERENCE TO RELATED APPLICATIONS

This application is a continuation of U.S. patent application Ser. No. 12/339,665, filed on Dec. 19, 2008, and claims priority to Korean Patent Application No. 10-2008-0114624, filed on Nov. 18, 2008, both of which are hereby incorporated by reference for all purposes as if fully set forth herein.

BACKGROUND

The present disclosure relates to a light emitting device, and more particularly, to a light emitting device that is configured to enhance adhesive force between a lead frame and a molding unit by forming a fixing space through the lead frame and integrally forming the molding unit on the top surface of the lead frame and in the fixing space.

Generally, a light emitting device uses a variety of light emitting chips. For example, a light emitting diode (LED) uses an element that generates minority carriers (electrons or holes) injected using a p-n junction of a semiconductor and emits light by recombination of the carriers. The LED consumes less electricity and has several to tens times more service life than the incandescent light bulb or a fluorescent lamp. That is, the LED is excellent in terms of the power consumption and endurance.

Since the LEDs can efficiently emit the light using a low voltage, they have been used for home appliances, electronic display boards, display devices, and a variety of automated machines. Recently, as the devices are getting smaller and slimmer, the LEDs have been made in a surface mount device type so that they can be directly mounted on a printed circuit board. Particularly, a light emitting device that is designed such that a separate insulation substrate is not used but a lead frame is used instead of the insulation substrate and a molding unit is directly formed on the lead frame has been recently proposed.

However, there are limitations due to a structure of the molding unit formed only on a top surface of the lead frame in that a phenomenon where a boundary surface between the lead frame and the molding unit is widened as the molding unit is easily separated from the lead frame by external causes such as increase of ambient temperature during a reflow process occurs.

Accordingly, the light emitting diode and wires enclosed by the molding unit may be damaged by being exposed to air or moisture. In addition, a bending portion may be cut by the separation of the molding unit.

SUMMARY

The present disclosure provides a light emitting device that is designed to physically improve adhesive force between a lead frame and a molding unit by forming a fixing space through the lead frame and integrally forming the molding unit on a top surface of the lead frame and in the fixing space during a molding unit forming process.

In accordance with an exemplary embodiment, a light emitting device including: a plurality of lead frame units spaced apart from each other, each of the lead frame units being provided with at least one fixing space perforating a body thereof in a vertical direction; a light emitting diode chip mounted on one of the lead frame units; and a molding unit that is integrally formed on top surfaces of the lead frame units and in the fixing spaces to protect the light emitting diode chip.

The fixing spaces may include outer fixing holes that are formed at all or some of a region where the lead frame units face each other and opposite side edge regions of the lead frame units.

The fixing spaces may include at least one inner fixing hole formed in an inner region of the lead frame units.

Stepped portions may be formed on sidewalls of the fixing spaces so that a lower portion area of the fixing space is greater than an upper portion area of the fixing space.

Inclined surfaces may be formed at the sidewalls of the fixing spaces so that a lower portion area of the fixing space is greater than an upper portion area of the fixing space.

The light emitting device may further include a reflector formed on top surfaces of the lead frame units and surrounding the light emitting diode chip.

The molding unit may include a phosphor to alter a wavelength of light emitted from the light emitting diode chip.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings.

Figure 1:
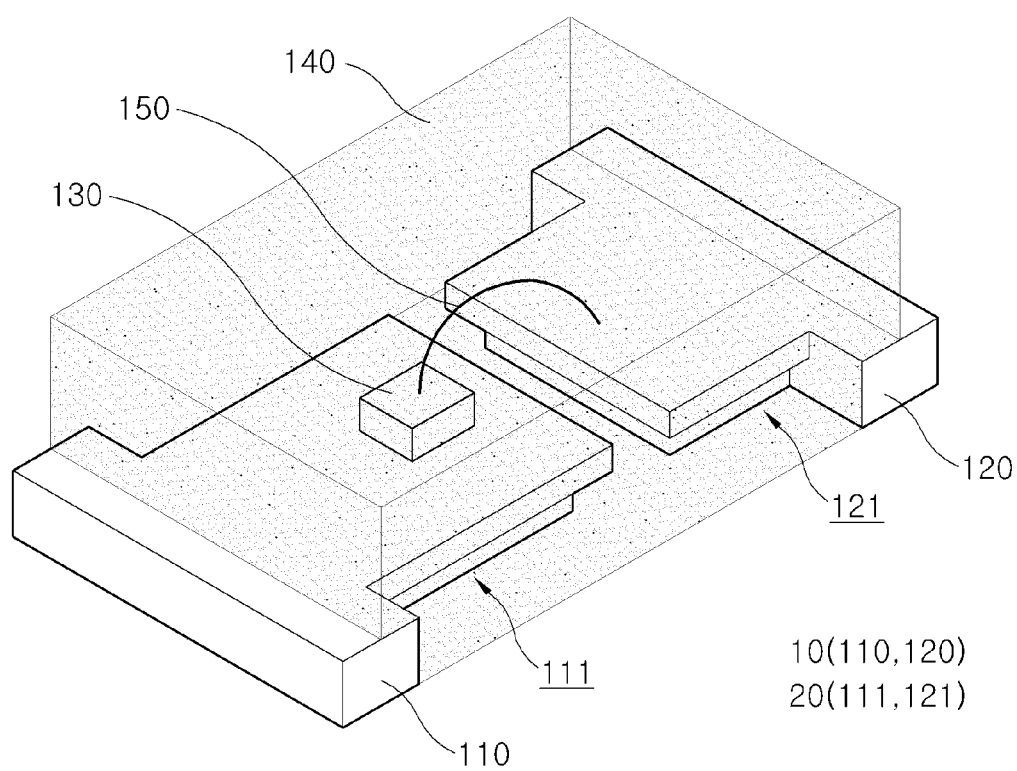
FIG. 1 is a perspective view of a light emitting device according to an exemplary embodiment.
Figure 2:
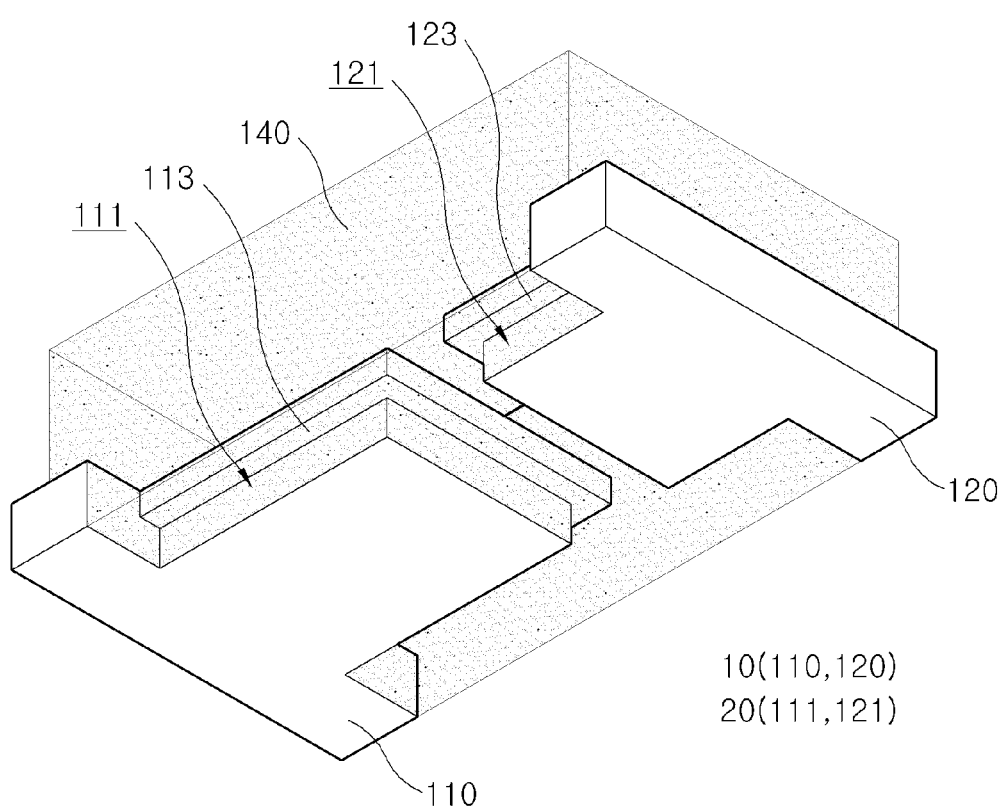
FIG. 2 is a bottom perspective view of the light emitting device of FIG. 1.
Figure 3A:
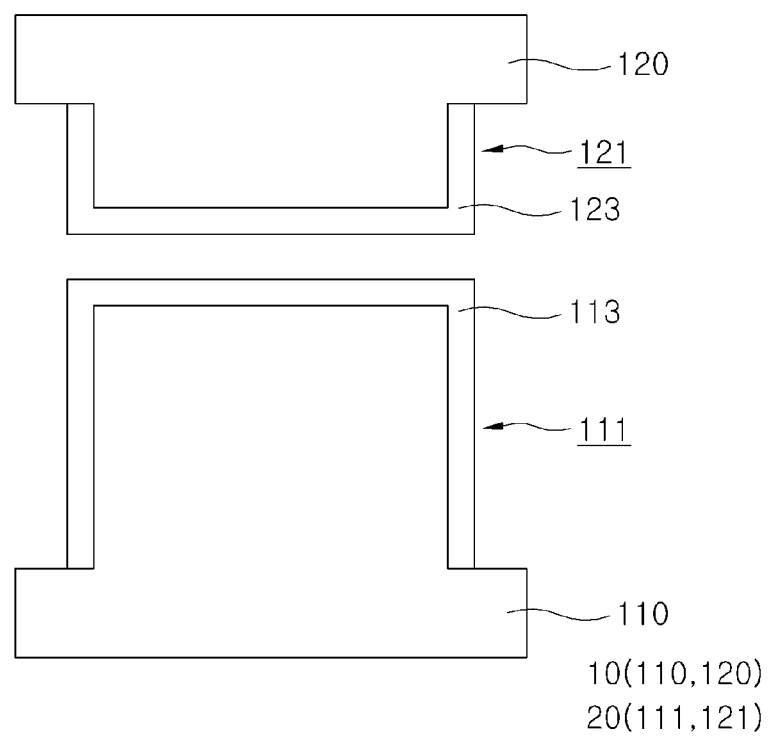
FIG. 3a is a bottom view of a lead frame depicted in FIGS. 1 and 2.
Figure 3B:
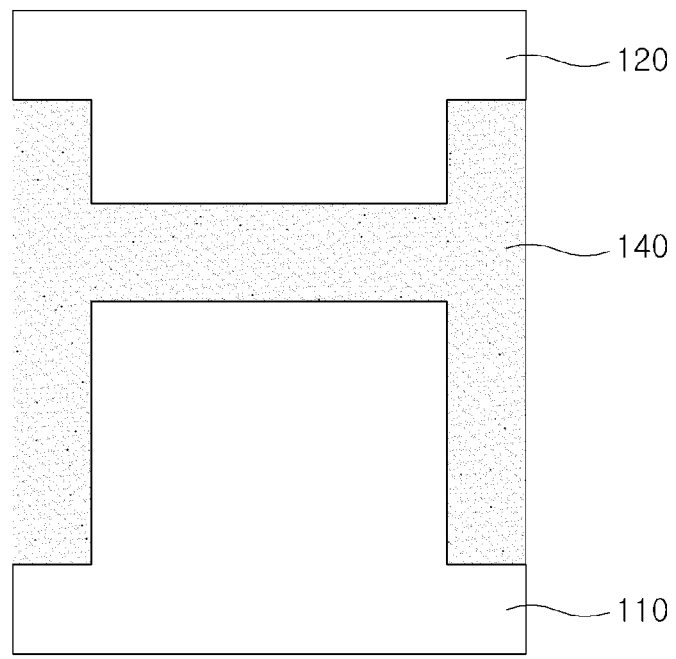
FIG. 3b is a bottom view of the light emitting device of FIGS. 1 and 2.

FIG. 1 is a perspective view of a light emitting device according to an exemplary embodiment, FIG. 2 is a bottom perspective view of the light emitting device of FIG. 1, FIG. 3a is a bottom view of a lead frame depicted in FIGS. 1 and 2, and FIG. 3b is a bottom view of the light emitting device of FIGS. 1 and 2.

As shown in FIGS. 1 to 3b, a light emitting device according to an exemplary embodiment includes a plurality of lead frame units 10, a light emitting diode chip 130 mounted on one of the lead frame units 10, and a molding unit 140 that is formed on a top surface of the lead frame units 10 to protect the light emitting diode chip 130.

The lead frame units 10 are for mounting the light emitting diode chip 130 or connected to the light emitting diode chip 130 to apply external power to the light emitting diode chip 130. In this exemplary embodiment, a separate supporting unit such as a separate insulation substrate for supporting the lead frame units 10 is not provided, but the lead frame unit 10 formed of metal functions as the substrate. For example, the lead frame units 10 include first and second lead frames 110 and 120 that are spaced apart from each other at a predetermined interval. At this point, the first and second lead frames 110 and 120 may not be formed in a plate shape but in a convex shape.

The first and second lead frames 110 and 120 are provided with fixing spaces formed through bodies of the first and second lead frames 110 and 120 in a vertical direction.

When the molding unit 140 is formed on top surfaces of the first and second lead frames 110 and 120, molding resin for the molding unit 140 is filled in the fixing spaces 20 such that the molding resin applied on the top surfaces of the first and second lead frames 110 and 120 and the molding resin filled in the fixing spaces 20 can be monolithic. That is, the fixing spaces 20 function to allow the molding unit 140 to be securely adhered to the top surfaces of the lead frame units 10.

As shown in FIGS. 1 through 3*b*, the fixing spaces include outer fixing holes 111 and 121 that are formed at a region where the first and second lead frames 110 and 120 face each other and a region surrounding opposite side edges of the respective first and second lead frames 110 and 120. At this point, the outer fixing holes 111 and 121 may be some or all of the above described regions. In this exemplary embodiment, the fixing holes 111 and 121 are formed to be connected to each other at the facing region where the first and second lead frames 110 and 120 face each other and the regions adjacent to the facing regions.

At this point, stepped portions 113 and 123 may be formed on sidewalls of the outer fixing holes 111 and 121 such that an area of a lower portion of each of the outer fixing holes 111 and 121 is greater than an upper portion of each of the outer fixing holes 111 and 121. Therefore, the molding unit 140 formed on the top surfaces of the first and second lead frames 110 and 120 extends to the outer fixing holes 111 and 121 and is hooked on the stepped portions 113 and 123. Therefore, the separation of the molding unit 140 from the first and second lead frames 110 and 120 can be physically prevented. A method for making the lower portion of the molding unit 140 formed in the outer fixing holes 111 and 121 have a greater area than the upper portion of the molding portion 140 is not limited to the above. That is, the method may be variously modified and the modified examples will be described later.

The light emitting diode chip 130 is for emitting light by receiving the external power. The light emitting diode chip 130 may be selected among chips that emit light from an infrared band to a ultraviolet band. The light emitting diode chip 130 is mounted on the first lead frame 110 and electrically connected to the second lead frame 120 by a wire 150. The wire 150 may be formed of gold (Au) or aluminum (Al) through and connected to the second lead frame 120 through, for example, a wire connecting process.

The molding unit 140 is for protecting the light emitting diode chip 130 and the wire 150 by enclosing the same. A method of forming the molding unit 140 and a shape of the molding unit 140 can be variously realized. For example, the molding unit 140 may be formed through a transfer molding method where a mold having a cavity having a polygonal or hemispherical cavity and molding resin is filled in the cavity. In this exemplary embodiment, the molding unit 140 is formed through a transfer molding method using a mold having a cavity that is designed to apply the molding resin on a portion of the top surfaces of the first and second lead frames 110 and 120 and fill the molding resin in the fixing holes 111 and 121. Therefore, the molding unit 140 is integrally formed a portion of the top surfaces of the first and second lead frames 110 and 120, which includes a first region at which the light emitting diode chip 130 and the wire 150 are formed, a second region around the first region, and a third region defining the fixing space 20.

The molding unit 140 may be formed of transparent silicon resin or epoxy resin that has a relatively high rigidity. However, the present invention is not limited to this. That is, other kinds of resin that is transparent to transmit light may be used in accordance with the use of the light emitting device. Further, a variety of phosphors (not shown) may be mixed with the molding unit 140 to realize a variety of colors by changing a wavelength of the light emitted from the light emitting diode chip 130.

Figure 4:
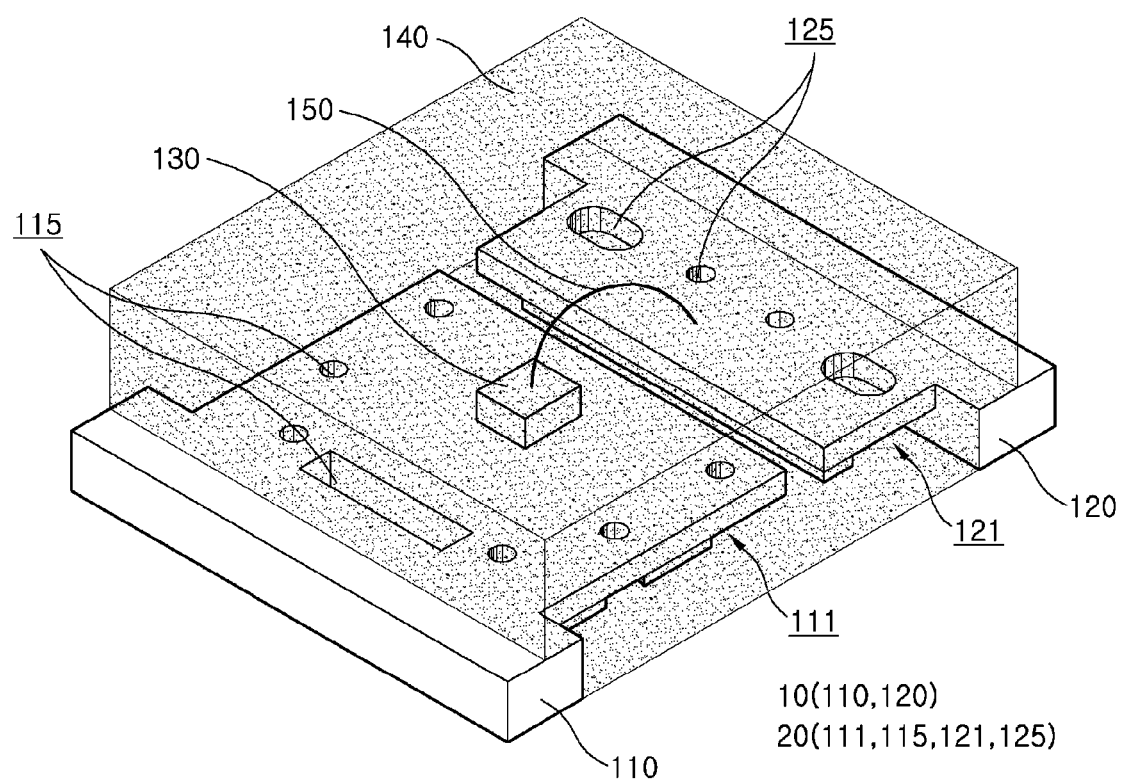
FIG. 4 is a perspective view of a light emitting device according to another exemplary embodiment.
Figure 5:
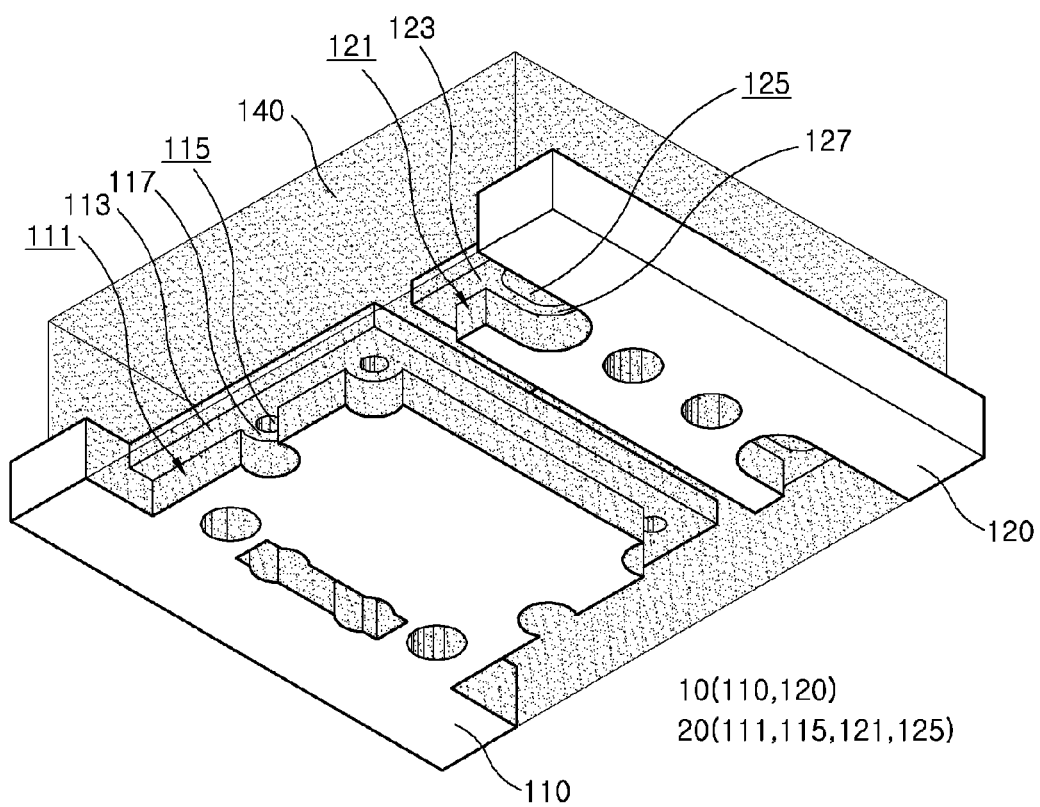
FIG. 5 is a bottom perspective view of the light emitting device of FIG. 4.
Figure 6A:
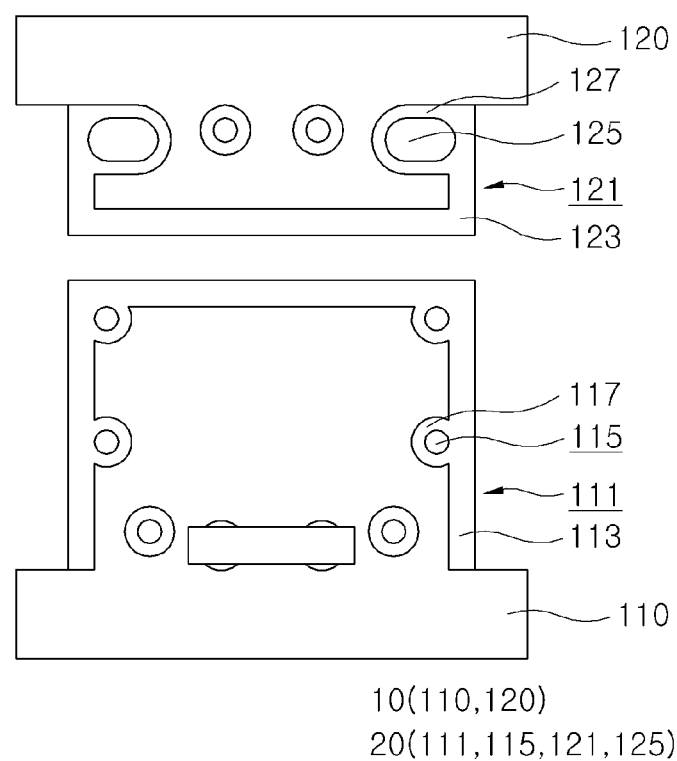
FIG. 6a is a bottom view of a lead frame depicted in FIGS. 4 and 5.
Figure 6B:
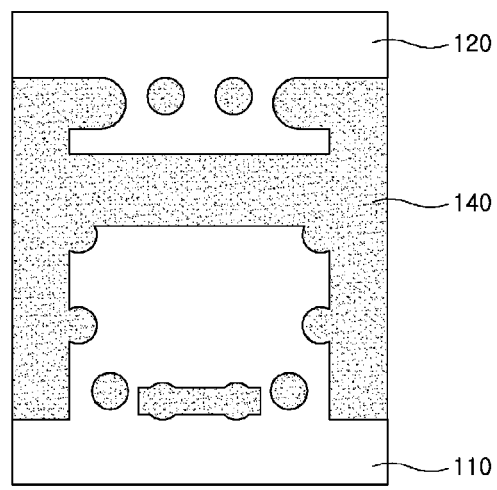
FIG. 6b is a bottom view of the light emitting device of FIGS. 4 and 5.

FIG. 4 is a perspective view of a light emitting device according to another exemplary embodiment, FIG. 5 is a bottom perspective view of the light emitting device of FIG. 4, FIG. 6*a* is a bottom view of a lead frame depicted in FIGS. 4 and 5, and FIG. 6*b* is a bottom view of the light emitting device of FIGS. 4 and 5.

The light emitting device of this exemplary embodiment is almost identical to that of the foregoing embodiment of FIGS. 1 through 3*b* except that the fixing spaces 20 are modified. In the following description for this exemplary embodiment, parts identical to those of the foregoing exemplary embodiment will not be described.

Referring to FIGS. 4 through 6*b*, according to this exemplary embodiment, the fixing space 20 further includes one or more inner fixing holes 115 and 125 formed through the bodies of the first and second lead frames 110 and 120 in the vertical direction. Sizes, shapes, and number of the inner fixing holes 115 and 125 are not specifically limited. Any things will be possible as far as the portions of the molding unit 140, which are filled and formed in the inner fixing holes 115 and 125 are monolithic with the portion of the molding unit 140, which is formed on the top surfaces of the first and second lead frames 110 and 120. In this exemplary embodiment, the inner fixing holes 115 and 125 are formed in a variety of shapes such as a circular shape, an oval shape, and a rectangular shape. At this point, like the stepped portions 113 and 123 formed in the sidewalls of the outer fixing holes 111 and 121 in the foregoing exemplary embodiment, stepped portions 117 and 127 are formed on inner sidewalls of the inner fixing holes 115 and 125 such that an lower area is greater than an upper area. Accordingly, the molding unit 140 is hooked on the stepped portions 113, 117, 123, and 127 and thus the separation of the molding unit 140 from the first and second lead frames 110 and 120 can be prevented. are formed on inner walls Although the fixing spaces 20 include all of the outer fixing holes 111 and 121 and the inner fixing holes 115 and 125 as in this exemplary embodiment, it may be possible the fixing spaces 20 include only the inner fixing holes 115 and 125.

Figure 7:
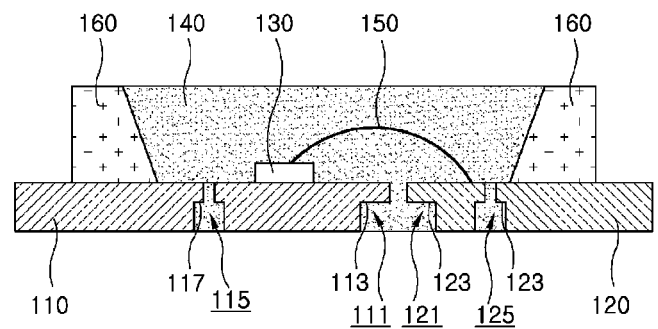
FIGS. 7 to 9 are cross-sectional views illustrating modified examples of the light emitting devices of the exemplary embodiments of FIGS. 1 through 6b.
Figure 8:
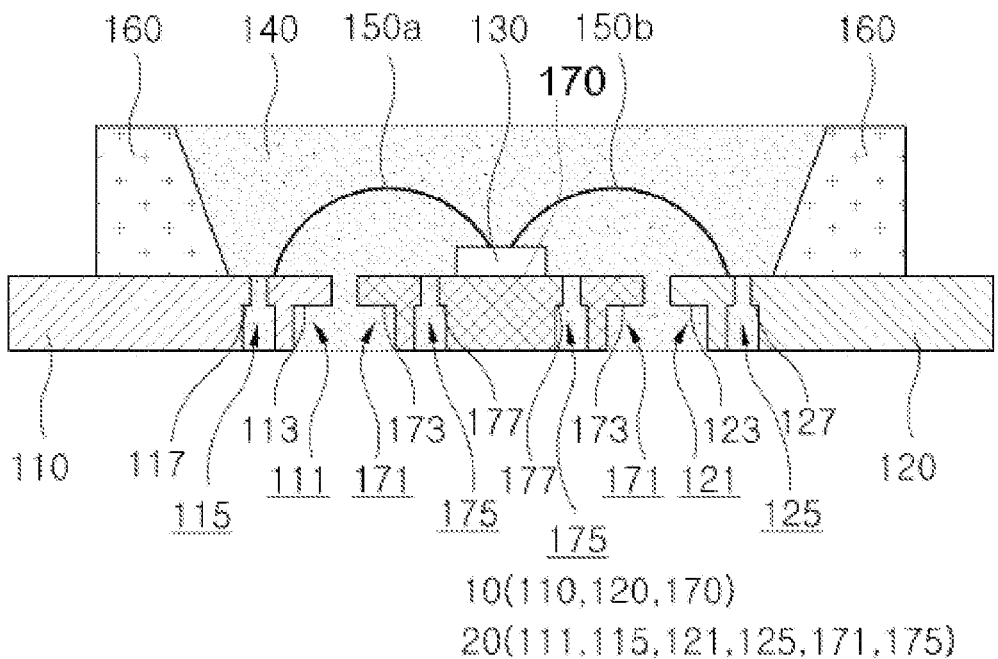
Figure 9:
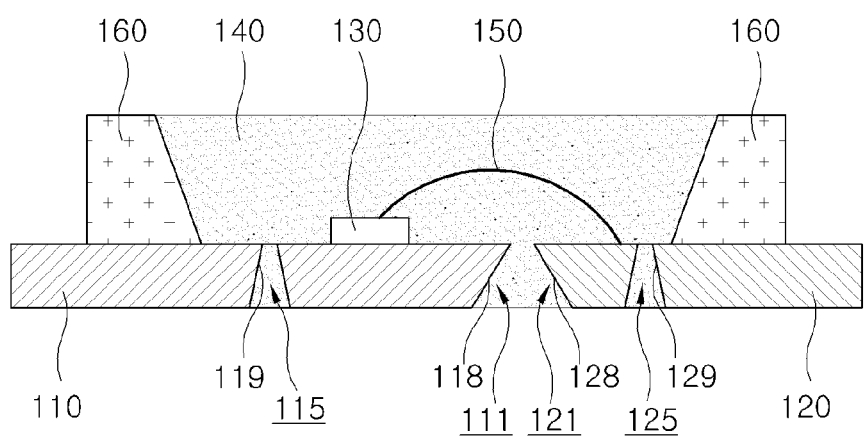

FIGS. 7 to 9 are cross-sectional views illustrating modified examples of the light emitting device of the foregoing exemplary embodiments.

The modified examples of FIGS. 7 to 9 are almost similar to the foregoing embodiments of FIGS. 1 through 6*a* except that a reflector 160 is further provided, the lead frame unit 10 is modified, and the fixing spaces 20 are modified. In the following description for the modified example, parts identical to those of the foregoing embodiments will not be described.

In the modified example of FIG. 7, a reflector 160 for collecting or scattering the light emitted from the light emitting diode chip 130 is formed on an edge of the top surfaces of the lead frame units 10. At this point, a reflecting surface is formed on an inner surface of the reflector 160 to direct the light emitted from the light emitting diode chip 130 in a desired direction. Alternatively, the reflector 160 may be formed of a transparent material to scatter the light generated from the light emitting diode chip 130 in a desired direction.

The reflector 160 may be formed through the previously described transfer molding method. In addition, as the reflector 160 is formed, the molding unit 140 may be formed through not only the transfer molding method but also a dotting method.

In the modified example of FIG. 8, unlike the foregoing embodiments, the lead frame units 10 include three lead frames spaced apart from each other. For example, the lead frame units 10 may further include a third lead frame 170 disposed between the first and second lead frames 110 and 120 and the light emitting diode chip 130 is mounted on the third lead frame 170. At this point, a contacting surface between the light emitting diode chip 130 and the third lead frame 170 may be insulated. In addition, the light emitting diode chip 130 is electrically connected to the first and second lead frames 110 and 120 by respective wires 150a and 150b.

At this point, the outer fixing holes 111 and 121 and the inner fixing holes 115 and 125 are formed through the first and second lead frames 110 and 120 and the stepped portions 113, 117, 123, and 127 are formed on the sidewalls of the outer and inner fixing holes 111, 121, 115, and 125. Likewise, outer and inner fixing holes 171 and 175 are formed through the third lead frame 170 and stepped portions 137 and 177 are formed on sidewalls of the outer and inner fixing holes 171 and 175. Accordingly, the adhesive force between the molding unit 140 and the lead frame units 10 can be improved. Further, the reflector 160 may be formed on the first and second lead frames 110 and 120.

In the modified example of FIG. 9, a shape of the fixing spaces is varied. That is, instead of forming the stepped portions 113, 117, 123, and 127 on the sidewalls of the outer and inner fixing holes 111, 121, 115, and 125 so that the lower area can be greater than the upper area, the inner sidewalls of the outer and inner fixing holes 111, 121, 115, and 125 are provided with inclined surfaces 118, 119, 128, and 129 such that the areas of the outer and inner fixing holes 111, 121, 115, and 125 gradually increase downward. Although the inclined surfaces are formed on all of the inner sidewalls of the fixing spaces 20, the present invention is not limited to this configuration. That is, the inclined surfaces may be formed only on some of the inner walls. Accordingly, the separation of the molding unit 140 can be prevented by portions of the molding unit 140 that are filled and formed in the outer and inner fixing holes 111, 121, 115, and 125.

According to the exemplary embodiments, a phenomenon where a boundary surface between the lead frame and the molding unit is widened can be prevented by improving an adhering performance of the molding unit to the lead frame by forming the fixing space through the body of the lead frame in the vertical direction and integrally forming the molding unit on a top surface of the lead frame and in the fixing space of the lead frame.

Furthermore, as the upper area of the fixing space is less than the lower area of the fixing space, the separation of a portion of the molding unit, which is formed on the top surface of the lead frame, from the lead frame can be physically prevented by a portion of the molding unit, which is formed on the fixing space.

Although the light emitting device has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A light-emitting device, comprising:
   first and second lead frames spaced apart from each other, the first and second lead frames each comprising a first surface, a second surface opposite to the first surface, and sidewalls arranged between the first surface and the second surface thereof, wherein at least one of the first and second lead frames comprises an inset sidewall, the inset sidewall undercutting at least one of the first surface and the second surface and at least partially defining a fixing space;
   a light-emitting diode chip arranged on the first surface of the first or second lead frames; and
   a molding unit disposed on the first surfaces of the first and second lead frames and in the fixing space, the molding unit covering the light-emitting diode chip,
   wherein the fixing space is continuously disposed along three sides of at least one of the first and second lead frames.

2. The light-emitting device of claim 1, wherein the first lead frame comprises an inset sidewall and the second lead frame comprises a fixing hole.

3. The light-emitting device of claim 1, wherein the first surface and the second surface of the at least one of the first and second lead frames have different surface areas from each other.

4. The light-emitting device of claim 1, wherein at least one sidewall of the first or second lead frame is inclined, and a corresponding first surface and second surface of the first or second lead frame comprise different surface areas from each other.

5. The light-emitting device of claim 1, further comprising a reflector arranged on the first surface of each of the first and second lead frames, the reflector surrounding the light-emitting diode chip.

6. The light-emitting device of claim 1, wherein the molding unit comprises a phosphor disposed therein.

7. The light-emitting device of claim 1, wherein each of the first and second lead frames comprises an inset sidewall.

8. The light-emitting device of claim 1, wherein the sidewalls comprise a stepped structure.

9. The light-emitting device of claim 8, wherein the stepped structure is continuously arranged along at least one of three sides of at least one of the first and second lead frames.

10. The light-emitting device of claim 1, wherein the at least one of the first and second lead frames comprises a fixing hole, the fixing hole extending from the first surface to the fixing space.

11. The light-emitting device of claim 10, wherein the sidewalls comprise a stepped structure.

12. The light-emitting device of claim 10, wherein the sidewalls are inclined.

13. The light-emitting device of claim 10, wherein the inset sidewall comprises a concave portion, wherein the concave portion at least partially surrounds the fixing hole.

* * * * *